(12) United States Patent
Huff et al.

(10) Patent No.: US 7,721,401 B2
(45) Date of Patent: May 25, 2010

(54) REINFORCEMENT OF IRREGULAR PRESSURE VESSELS

(75) Inventors: Philip A. Huff, Spring, TX (US); Shafiq Khandoker, Houston, TX (US)

(73) Assignee: Hydril USA Manufacturing LLC, Houston, TX (US)

( * ) Notice: Subject to any disclaimer, the term of this patent is extended or adjusted under 35 U.S.C. 154(b) by 594 days.

(21) Appl. No.: 11/528,873

(22) Filed: Sep. 28, 2006

(65) Prior Publication Data

US 2010/0095507 A1    Apr. 22, 2010

(51) Int. Cl.
*B23Q 17/00* (2006.01)
(52) U.S. Cl. .................................. 29/407.05; 29/402.09
(58) Field of Classification Search ............. 29/402.09, 29/407.01, 407.05, 407.08, 428, 890.12, 29/890.124; 145/622, 328, 559, 675, 607; 251/1.3; 166/363
See application file for complete search history.

(56) References Cited

U.S. PATENT DOCUMENTS

| | | | |
|---|---|---|---|
| 2,609,836 A | | 9/1952 | Knox |
| 2,834,702 A | * | 5/1958 | Gibb ........................ 220/562 |
| 3,667,721 A | | 6/1972 | Vujasinovic |
| 4,347,898 A | | 9/1982 | Jones |
| 4,647,002 A | | 3/1987 | Crutchfield |
| 4,702,321 A | | 10/1987 | Horton |
| 5,655,745 A | | 8/1997 | Morrill |
| 5,665,745 A | | 9/1997 | Alt et al. |
| 5,806,314 A | | 9/1998 | Younes |
| 5,819,013 A | | 10/1998 | Miyazaki et al. |
| 5,839,511 A | | 11/1998 | Williams |
| 5,897,094 A | | 4/1999 | Brugman et al. |

(Continued)

FOREIGN PATENT DOCUMENTS

JP    57105647    6/1982

(Continued)

OTHER PUBLICATIONS

PCT International Search Report and the Written Opinion of the International Searching Authority, or the Declaration issued in related international application PCT/US2007/079461 dated Jan. 18, 2008, (10 pages).

(Continued)

*Primary Examiner*—John C Hong
(74) *Attorney, Agent, or Firm*—Potomac Patent Group PLLC

(57) ABSTRACT

A method of manufacturing a ram blowout preventer including analyzing a first model of a ram blowout preventer, identifying regions of high stress concentrations in the first model at a selected loading condition, constructing the ram blowout preventer, and selectively reinforcing the regions of high stress concentration corresponding to the manufactured ram blowout preventer. Other embodiments include a method to reinforce an irregular pressure vessel, including analyzing the irregular pressure vessel, identifying regions of high stress concentration in the irregular pressure vessel, and selectively reinforcing the regions of high stress concentration. Other embodiments include a ram blowout preventer having a body, a vertical bore through the body, a horizontal through the body intersecting the vertical bore, two ram assemblies disposed in the horizontal bore on opposite sides of the body, wherein the ram assemblies are adapted for controlled lateral movement to and from the vertical bore, and wherein a portion of the body is selectively reinforced.

18 Claims, 8 Drawing Sheets

U.S. PATENT DOCUMENTS

| | | |
|---|---|---|
| 5,997,665 A | 12/1999 | Brisson et al. |
| 6,173,770 B1 | 1/2001 | Morrill |
| 6,244,560 B1 | 6/2001 | Johnson |
| 6,403,235 B1 | 6/2002 | Glidden et al. |
| 6,554,247 B2 | 4/2003 | Berckenhoff et al. |
| 6,737,174 B1 | 5/2004 | Bianchi et al. |
| 6,884,959 B2 | 4/2005 | Gandy et al. |
| 2008/0078081 A1 | 4/2008 | Huff et al. |
| 2008/0078554 A1 | 4/2008 | Huff et al. |
| 2008/0105340 A1 | 5/2008 | Huff et al. |
| 2008/0105341 A1 | 5/2008 | Huff et al. |

FOREIGN PATENT DOCUMENTS

| | | |
|---|---|---|
| JP | 61170551 | 8/1986 |
| JP | 01182505 | 7/1989 |
| JP | 2004162130 | 6/2004 |

OTHER PUBLICATIONS

Office Action for Related U.S. Appl. No. 11/555,984 mailed Mar. 4, 2009.

Office Action for Related U.S. Appl. No. 11/626,148 mailed Jun. 18, 2009.

International Search Report and Written Opinion dated Oct. 30, 2008 issued in related International Application No. PCT/US2007/083528, 10 pages.

International Search Report and Written Opinion dated Apr. 23, 2008 issued in related International Application No. PCT/US2007/083530, 14 pages.

US Office Action issued in corresponding U.S. Appl. No. 11/555,984 on Sep. 4, 2009.

\* cited by examiner

REINFORCEMENT OF IRREGULAR PRESSURE VESSELS

BACKGROUND OF INVENTION

1. Field of the Invention

Embodiments disclosed herein relate generally to irregular pressure vessels used in the oil and gas industry. Specifically, embodiments disclosed herein relate to a method of manufacturing or reinforcing blowout preventers.

2. Background

Well control is an important aspect of oil and gas exploration. When drilling a well, for example, safety devices must be put in place to prevent injury to personnel and damage to equipment resulting from unexpected events associated with the drilling activities.

The process of drilling wells involves penetrating a variety of subsurface geologic structures, or "layers." Occasionally, a wellbore will penetrate a layer having a formation pressure substantially higher than the pressure maintained in the wellbore. When this occurs, the well is said to have "taken a kick." The pressure increase associated with the kick is generally produced by an influx of formation fluids (which may be a liquid, a gas, or a combination thereof) into the wellbore. The relatively high pressure kick tends to propagate from a point of entry in the wellbore uphole (from a high pressure region to a low pressure region). If the kick is allowed to reach the surface, drilling fluid, well tools, and other drilling structures may be blown out of the wellbore. Such "blowouts" may result in catastrophic destruction of the drilling equipment (including, for example, the drilling rig) and substantially injure or result in the death of rig personnel.

Because of the risk of blowouts, devices known as blowout preventers are installed above the wellhead at the surface or on the sea floor in deep water drilling arrangements to effectively seal a wellbore until active measures can be taken to control the kick. Blowout preventers may be activated so that kicks are adequately controlled and "circulated out" of the system. There are several types of blowout preventers, the most common of which are ram blowout preventers and annular blowout preventers (including spherical blowout preventers).

Annular blowout preventers typically use large, annular, rubber or elastomeric seals having metal inserts, which are referred to as "packing units." The packing units may be activated within a blowout preventer to encapsulate drill pipe and well tools to completely seal an "annulus" between the pipe or tool and a wellbore. In situations where no drill pipe or well tools are present within the bore of the packing unit, the packing unit may be compressed such that its bore is entirely closed. Typically, packing units seal about a drill pipe, in which the packing unit may be quickly compressed, either manually or by machine, to result in a seal thereabout, preventing well pressure from causing a blowout. Examples of annular blowout preventers are disclosed in U.S. Pat. Nos. 2,609,836 and 5,819,013, each of which is incorporated herein by reference in their entireties. An example of a spherical blowout preventer is disclosed in U.S. Pat. No. 3,667,721, incorporated herein by reference in its entirety.

Ram blowout preventers typically have a body and at least one pair of horizontally opposed bonnets. The bonnets are generally secured to the body about their circumference with, for example, bolts. Alternatively, bonnets may be secured to the body with a hinge and bolts so that the bonnet may be rotated to the side for maintenance access. Interior of each bonnet is a piston actuated ram. The rams may be either pipe rams (which, when activated, move to engage and surround drill pipe and well tools to seal the wellbore), shear rams (which, when activated, move to engage and physically shear any drill pipe or well tools in the wellbore), or blind rams (which, when activated, seal the bore like a gate valve). The rams are typically located opposite of each other and, whether pipe rams, shear rams, or blind rams, the rams typically seal against one another proximate a center of the wellbore in order to completely seal the wellbore.

The rams are generally constructed of steel and fitted with elastomeric components on the sealing surfaces. The ram blocks are available in a variety of configurations allowing them to seal a wellbore. Pipe rams typically have a circular cutout in the middle that corresponds to the diameter of the pipe in the hole to seal the well when the pipe is in the hole; however, these pipe rams effectively seal only a limited range of pipe diameters. Variable-bore rams are designed to seal a wider range of pipe diameters. The various ram blocks may also be changed within the blowout preventers, allowing well operators to optimize the blowout preventer configuration for the particular hole section or operation in progress. Examples of ram type blowout preventers are disclosed in U.S. Pat. Nos. 6,554,247, 6,244,560, 5,897,094, 5,655,745, and 4,647,002, each of which is incorporated herein by reference in their entireties.

FIG. 1 presents a cross-section of an embodiment of a ram blowout preventer, and as described in U.S. Pat. No. 4,647, 002. A blowout preventer housing body 104 may have a vertical bore 102 in which a tubular member 100 (e.g., drill pipe or oil tools) may be inserted. Housing body 104 may have one or more horizontal bores 106, 108 (two horizontal bores in a dual ram blowout preventer configuration, as illustrated). In horizontal bore 106 are ram blocks 60, shown in cross-section, each having a top seal 10 and a packing element 24. As illustrated, ram blocks 60 are in the open position. When ram blocks 60 are closed, top seal 10 acts to seal about the upper surface of horizontal bore 106 while packing element 24 inwardly seals about tubular member 100 as shown in second horizontal bore 108.

Ram blowout preventers are currently manufactured for various bore size ranges, and typically have a working pressure range from 2,000 to 15,000 psi. For example, a ram blowout preventer rated for operation at 15,000 psi may be manufactured with a base material, such as a low-alloy steel having a minimum material yield strength of 85,000 psi throughout the section thickness of the body. This minimum yield strength is necessary to prevent plastic deformation or failure of the body during both the hydro test pressure at 150% of the working pressure range (22,500 psi internal water test pressure) and during the 15,000 psi maximum internal operating pressure. The yield strength (85,000 psi) of these 15,000 psi rated ram blowout preventer bodies have been determined to be comfortably above the minimum requirements necessary for the pressure rating.

However, it may be desired to use ram blowout preventers at high pressure, high temperature conditions (above 15,000 psi and greater than 250° F.). Particularly, ram blowout preventers rated at working pressures of 20,000 psi, 25,000 psi, and higher and working temperatures of up to 350° F. or higher, may be desired. Such blowout preventers would need to meet the design criteria for metallic oil and gas field components, such as those requirements established by NACE International (formerly the National Association of Corrosion Engineers) and the European Federation of Corrosion for the performance of metals when exposed to various environmental compositions, pH, temperatures, and $H_2S$ partial pressures (including NACE MR0175, NACE TM0177, and NACE TM0284).

Alloys currently used as a base material to manufacture ram blowout preventers may not perform adequately at the higher pressures, subjecting the ram blowout preventer to plastic deformation or failure of the body. One method to produce blowout preventers with the desired high pressure rating could include manufacturing a ram blowout preventer from a higher strength base material, such as a solid high strength corrosion resistant alloy forging. However, such high strength corrosion resistant alloys are typically available only in ingots of 30,000 pounds or less, whereas approximately 100,000 pounds or more may be required to manufacture a dual cavity ram blowout preventer body. More importantly, manufacture of a blowout preventer body with such a base material may be cost prohibitive as such high-strength corrosion resistant alloys are much more expensive than low-alloy steel and are not as easily machinable as their lower strength counterparts.

Accordingly, there exists a need for high pressure, high temperature ram blowout preventers. Additionally, there exists a need for an economical means to manufacture the blowout preventers rated for operation at higher pressures and temperatures.

SUMMARY OF INVENTION

In one aspect, embodiments disclosed herein relate to a method of manufacturing a ram blowout preventer. The method may include analyzing a first model of a ram blowout preventer, identifying regions of high stress concentrations in the first model at a selected loading condition, constructing the ram blowout preventer, and selectively reinforcing the regions of high stress concentration corresponding to the manufactured ram blowout preventer.

In another aspect, embodiments disclosed herein relate to a method to reinforce an irregular pressure vessel. The method may include analyzing the irregular pressure vessel, identifying regions of high stress concentration in the irregular pressure vessel, and selectively reinforcing the regions of high stress concentration.

In another aspect, embodiments disclosed herein relate to a ram blowout preventer. The ram blowout preventer may include a body, a vertical bore through the body, a horizontal through the body intersecting the vertical bore, two ram assemblies disposed in the horizontal bore on opposite sides of the body, wherein the ram assemblies are adapted for controlled lateral movement to and from the vertical bore, and wherein at least one portion of the body is selectively reinforced.

Other aspects and advantages of the invention will be apparent from the following description and the appended claims.

DETAILED DESCRIPTION

In one aspect, embodiments disclosed herein relate to a method of manufacturing or reinforcing an irregular pressure vessel. In other aspects, embodiments disclosed herein relate to an irregular pressure vessel that has been selectively reinforced. In some embodiments, a method to reinforce an irregular pressure vessel may include analyzing the irregular pressure vessel, identifying regions of high stress concentrations in the irregular pressure vessel, and selectively reinforcing the regions of high stress concentration.

Figure 1:
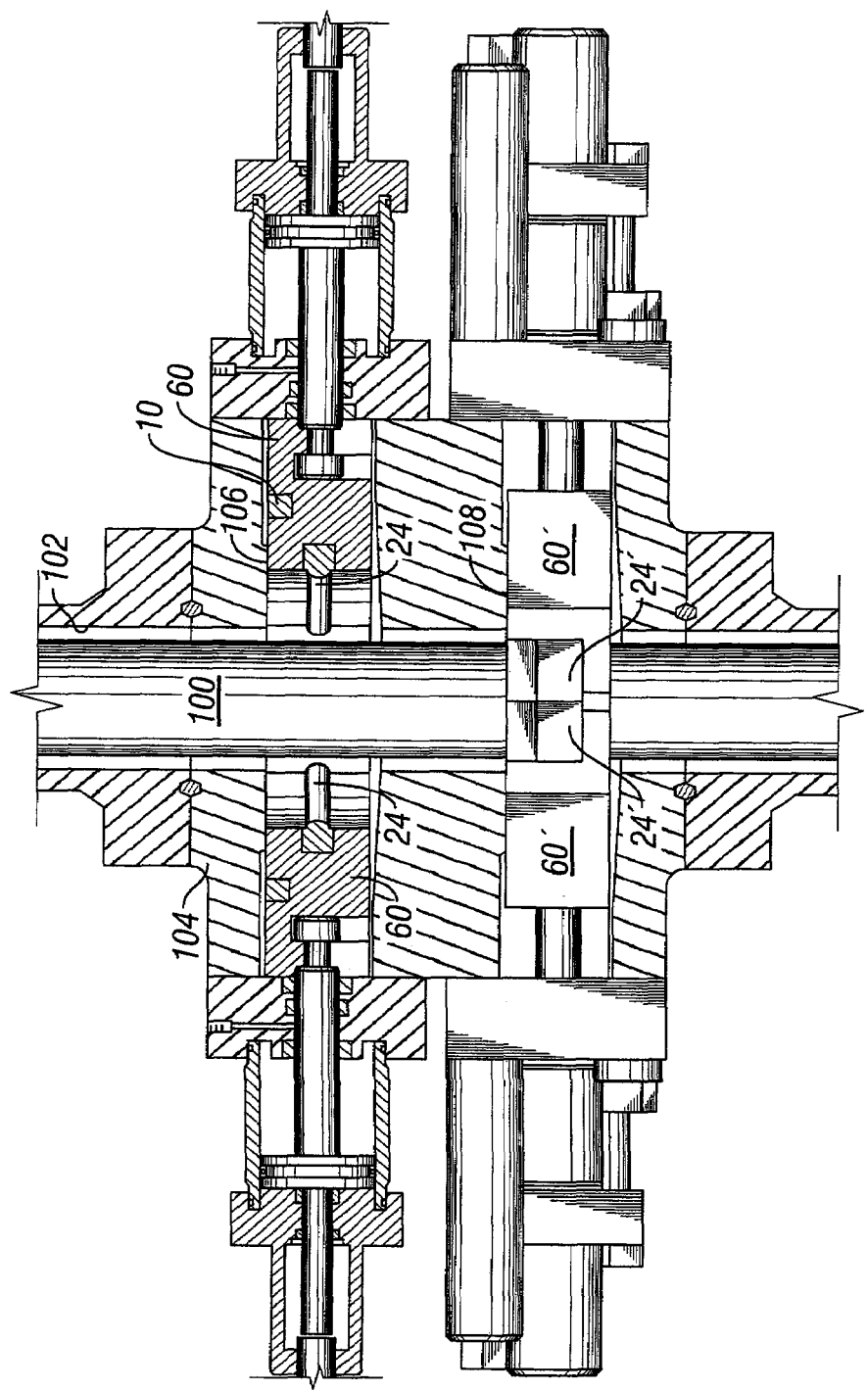
FIG. 1 is a side elevation view of a blowout preventer, partly in section in which the ram assembly member is illustrated and further illustrating two rams in a common housing in which one set of the ram members is closed about a tubular member in the vertical bore of the housing and the other set of ram assembly members is open.

As used herein, "irregular pressure vessel" refers to a vessel having a complex structure which may include multiple corners, rounded and sharp, bores, moving parts, and other various internal features generally not found in typical cylindrical or spherical pressure vessels. As illustrated in FIG. 1 and described above, a ram blowout preventer is one example of an irregular pressure vessel, having many internal corners, moving parts, and intersecting bores. Those skilled in the art will recognize that other blowout preventer designs are possible, and although not described in detail, embodiments disclosed herein apply equally to other blowout preventers and irregular pressure vessels. In some aspects, embodiments disclosed herein relate to a method of manufacturing a ram blowout preventer. In another aspect, embodiments disclosed herein relate to a ram blowout preventer that is selectively reinforced. In other aspects, embodiments disclosed herein relate to methods to selectively reinforce ram blowout preventers. In yet other aspects, embodiments disclosed herein relate to selectively reinforced ram blowout preventers rated for operation at high temperatures and/or high pressures.

During operation and, to a lesser extent, during testing (hydro-testing, pressure testing, etc.), ram blowout preventers experience stress and strain based on loading conditions, many of which may occur on a continuous, semi-continuous, or cyclic basis. Loading conditions may include thermal loading, pressure loading, or mechanical loading. For a subsea blowout preventer, thermal loading may occur when a wellbore is hot (e.g., 300° F.) and is located in 10,000 feet of water at 32° F. Pressure loading may result from internal (wellbore) pressure acting outward on the BOP or from hydrostatic external pressure acting inward. Further, mechanical loads may on blowout preventers may include bonnet and flange bolt tightening preloads, axial tensile and compressive loads, and bending moments. As such, the loading conditions may include at least one of internal pressure pushing outward on the body of the blowout preventer (at normal operating pressure or during a high-pressure kick), external pressure, axial tension, axial compression, longitudinal tension, longitudinal compression, axial bending moment, longitudinal bending moment, riser tension and bending, and temperature extremes, among other load states. The intensities of the local stress states placed on the equipment during these loading conditions may have a significant impact on the cyclic life of the equipment. Analyzing the performance of an irregular pressure vessel subject to various loading conditions characterized by large amounts of stress may provide for enhancing the vessel design, improving the performance of the BOP at higher temperatures and/or pressures.

Discrete element analysis (DEA) and finite element analysis (FEA) are useful and powerful techniques for analyzing stresses and strains in structures or components too complex to analyze by strictly analytical methods. With these techniques, the structure or component is broken down into many small pieces (a finite number of elements) of various types, sizes and shapes. The elements are assumed to have a simplified pattern of deformation (linear, quadratic, etc.) and are connected at "nodes" normally located at corners or edges of the elements. The elements are then assembled mathematically using basic rules of structural mechanics, i.e. equilibrium of forces and continuity of loads, resulting in a large system of simultaneous equations (a mesh).

By solving this large simultaneous equation system with the help of a computer, the deformed shape of the structure or component under load may be obtained. Based on that, stresses and strains may be calculated. Suitable software to perform such FEA includes ABAQUS (available from ABAQUS, Inc.), MARC (available from MSC Software Corporation), and ANSYS (available from ANSYS, Inc.), among others. Finite elements of any shape known in the art may be used. Hexagonal elements, though, are typically highly stable and may be beneficial when simulating high stresses and strains across a model.

A simplified BOP design and/or model of a BOP to assist in the analysis of the BOP may be used. For example, the analysis of stress and strain concentrations of complex BOP designs may be simplified by "smoothing" that design. As used herein, the term "smoothing" refers to various techniques to simplify a complex geometry of a design for use with FEA. For example, internal corners may be modified to reduce or eliminate their radii in an attempt to simplify a subsequently constructed model. These techniques may allow the analysis of a smoothed model (i.e., an FEA model constructed from a smoothed design) to correlate and converge to a definitive result when analysis of a non-smoothed model may not. As such, a model constructed from a smoothed design may be analyzed with FEA to determine an overall, or bulk, stress condition. By analyzing the bulk stress, the performance, and possible failure, of a BOP under various loading conditions may be predicted.

One objective of FEA may be to isolate high stress or strain areas and identify the areas that are prone to low cyclic life. The results of a finite element analysis, analyzing the performance of the vessel under various loading conditions, may be used to identify regions of high stress concentrations in the irregular pressure vessel. Once the high stress areas are identified, these areas may be re-designed or may be marked for metallurgical processing, such as selective reinforcement, as will be described later.

Possible load states or loading conditions for the BOP should be determined for input into the FEA. As mentioned above, these may include normal operating pressure, high-pressure kick, riser tension and bending, and temperature extremes, among other load states. The loading condition data should include typical or expected values as well as maximum and/or minimum values and the frequency at which these loads fluctuate to enable a complete analysis.

Properties of the base material used to form the BOP should also be determined, establishing the maximum allowable peak stress value (SBpeak). The material properties may either be determined through empirical testing or, in the alternative, may be provided from commercially available material properties data. For example, this value may be established based on field tests where, under NACE environments (i.e., environments established by NACE International for testing of oil and gas field equipment), the stress would just meet the life cycle requirement and would be less than the stress at which sulfide stress corrosion cracking would occur.

More particularly, the tensile properties of the BOP's base materials may be determined. The tensile strength of a material is the maximum amount of stress (in tension) a material may be subjected to before failure. As stress is exerted upon a material, the material strains to accommodate the stress. Once the stress is too much for the material, it will no longer be able to strain, and the material fails. The failure point of the material is known as the ultimate tensile strength.

The loading conditions and material properties may then be used to analyze the BOP using FEA based methods. All permutations for design and operating loads should be considered to generate a complete analysis of the BOP. Proper bolt preloads and material characteristic data, de-rated based on temperature, should also be used.

A model (i.e., a mesh of simultaneous equations) for the BOP is generated for use in the finite element analyses. A three-dimensional model of the blowout preventer may be generated with specific design features. These design features may be selected to give specific performance characteristics. Thus, generating a model may also include the steps of importing a BOP design to generate the BOP model and smoothing the imported BOP design. The BOP design may have various smoothing techniques applied thereto to simplify FEA analysis. The BOP models may be generated from a BOP design in a computer aided design ("CAD") software package (e.g., AutoCAD available from Autodesk, Inc., and Pro/Engineer available from Parametric Technology Corporation) and imported into the FEA software package. Alternatively, the BOP model may be generated within the FEA packages (e.g., ABAQUS and PATRAN) themselves.

Next, the loading conditions may be simulated upon the BOP in FEA using the BOP model. Preferably, these simulated loading conditions reflect the load states or stress that the BOP may expect to experience under normal use. Further, after simulating loading conditions upon the BOP model, a stress plot from the loading conditions showing the stress and deformation occurring in the BOP model may be analyzed. The stress plot may determine and show the location and amount of stress occurring in the BOP model from the simulated loading conditions across the BOP.

The stress plot may be analyzed and reviewed to determine the performance and characteristics of the BOP model. If the BOP model may be further improved, another BOP model may be generated or the current BOP model may be re-generated (modified). This will allow the BOP model to be further simulated in FEA to determine its performance after further modifications or models. Otherwise, if the BOP model is considered acceptable and meets any and/or all specified criteria, the BOP model may be used in the manufacture a blowout preventer, as will be described below.

The objectives of the above numerical methods (FEA analysis) include identifying, isolating, and highlighting zones of high or peak stress (SBpeak) states within the BOP equipment. For example, the stress states which may cause early failure under NACE environment may be identified. The results of the BOP FEA may be used to generate stress and strain plots for identifying regions of high stress concentrations in the vessel.

These plots, for example, may be used to isolate areas where stresses exceed 90% of base material yield strength. Areas in excess of 90% yield are particularly noted due to the performance and testing requirements imposed upon oil and gas field equipment. For example, for corrosive (NACE) environments, the design code may limit maximum strain to 90% of material yield so that design life cycle may be maintained. Areas where stresses may exceed 90% of base material yield include seat pockets, the BOP pocket near the bonnet, and BOP inner bores (vertical bores, horizontal bores, and the intersections of the vertical and horizontal bores). The results may also be used to calculate the depth of the high stress zones in excess of 90% yield.

The identified high stress zones may be modified in the manufacture of a BOP. For example, the zones may be marked out, in a spatial representation or drawing, noting the depth and lateral extents (length and width) of high stress areas exceeding the allowable SBpeak stress. A contour plot may be drawn, showing the length, width and depth of the local stress areas in excess of 90% of the base material yield strength. The surface location of the peak stress zones, for example, may be transferred to appropriate manufacturer's drawings. The identified high stress zones may then be selectively reinforced with a higher strength material bonding metallurgically with the base material.

In some embodiments, the base material may be selectively reinforced with an inlay clad. In other embodiments, the base material may be selectively reinforced with an overlay clad. The clad inlay or overlay may be bonded to the base material using pressure, heat, welding, brazing, roll bonding, explosive bonding, weld overlaying, wallpapering, or a combination thereof. In other embodiments, the cladding may be bonded to the base material using an electric arc weld cladding process, a hot isostatic pressing cladding process (HIP cladding), auto-frettage cladding, laser cladding, or a combination of any of these methods. In some embodiments, one or more clad layers may be used, such as a single clad having two layers (base plus clad), a double clad (having 3 layers), or a cladding of up to 7 or more layers.

In some embodiments, the base material may be selectively reinforced with a clad inlay. The clad inlay, in various embodiments, may be shrunk-fit or press fit into recesses cut in the body of the BOP, and seam/seal welded in place. In other embodiments, the clad inlay may be shaped according to the FEA stress plots.

The clad inlay or overlay, in some embodiments, may have a thickness or an average thickness of up to 0.625 inches or higher. In other embodiments, the clad inlay may have an average thickness in the range from about 0.010 inches to about 0.625 inches; from about 0.050 to about 0.500 inches in other embodiments; and from about 0.125 to about 0.375 inches in yet other embodiments.

In other embodiments, press-fit or shrink-fit component parts manufactured of the high-strength alloy may be used in conjunction with the irregular pressure vessel. For example, solid parts (e.g., flanges, bonnets, valve bodies, etc.) made of a high-strength alloy (e.g., Inconel 725) may be seal welded to the low-strength substrate after being pressed or shrunk-fit into the body.

In other embodiments, the base metals in the identified high stress zones may be replaced with a higher strength material bonding metallurgically to the base material. For example, the base metals in the high stress areas may be grinded and replaced with a higher strength material bonding metallurgically to the base material.

In some embodiments, the selective reinforcement is a clad overlay of higher strength material over a base material. In other embodiments, the selective reinforcement may be a clad overlay of higher strength material in ground or machined recesses in a base material.

The choice of the cladding alloy may be based on its ability to resist corrosion, including stress corrosion cracking, and its ability to add mechanical strength (e.g., by a metallurgical bond to the low-alloy substrate) to the part to which it is applied and intended to protect. In a typical overlay, for example, the strength of the cladding material is expected to at least equal the strength of the base metal to which it is applied. That is, the weld deposited alloy (such as Alloy 625) is expected to match the yield strength of the low-alloy steel base metal (such as low-alloy steel having a yield strength of 75,000 psi. However, embodiments of the selectively reinforced ram BOP bodies disclosed herein may be manufactured to operate under high pressure and high temperature conditions (e.g., at 20,000 psi maximum internal pressure and higher design operating pressures or where very high localized stresses are found). It may be possible to apply a cladding of a higher strength material in a thickness that will encapsulate the localized stresses in the higher strength clad layer, resulting in a ram BOP that will meet NACE or other standards for oil and gas field components and equipment while meeting the strength requirements of the design.

In some embodiments, the base material may be F22 low-alloy steel, a steel having approximately 2 weight percent chromium and 1 weight percent molybdenum. Those skilled in the art will recognize that other corrosion resistant materials, having appropriate corrosion resistance, hardness, and tensile properties suitable for use in an oil and gas environment, may also be used.

In some embodiments, the clad overlay or clad inlay may be formed from high yield strength, corrosion resistant alloys, such as Inconel 625 or Alloy 625 for example. Those skilled in the art will recognize that other high strength corrosion resistant materials may also be used as a cladding. Preferably, the cladding material is compatible with the base material. In some embodiments, the clad overlay or clad inlay may be formed with alloys with much higher yield strength than Alloy 625.

The alloys for use as a cladding may be available in the form of weld wire, powder, or strip filler metal for weld cladding and may also be available in the form of a powder intended to be used in a HIP cladding operation. These alloys may also be available in other forms that may be used in an auto-frettage cladding operation.

Once the cladding method or combination of cladding methods has been chosen, the minimum thickness and locations of the clad layer can be determined based on the results of the FEA stress analysis. The required thickness or depth of the cladding may vary depending upon the alloy used in forming the cladding, the bond formed between the clad and the base materials, as well as the dilution of the clad material resulting from the process used to bond the clad material to the base material. Once the values and location of the localized stress have been determined, the cladding alloy may be chosen. It may not be necessary to clad the entire ram BOP body. Particularly, only portions of the BOP body, including the wetted surfaces, the ram cavities, and the choke and kill side outlets of the ram BOP body, may need to be clad. Furthermore, it may be possible to selectively place a much lower clad thickness in lower stressed areas, thus preventing corrosion of those areas by the well bore fluid.

Examples

Figure 2:
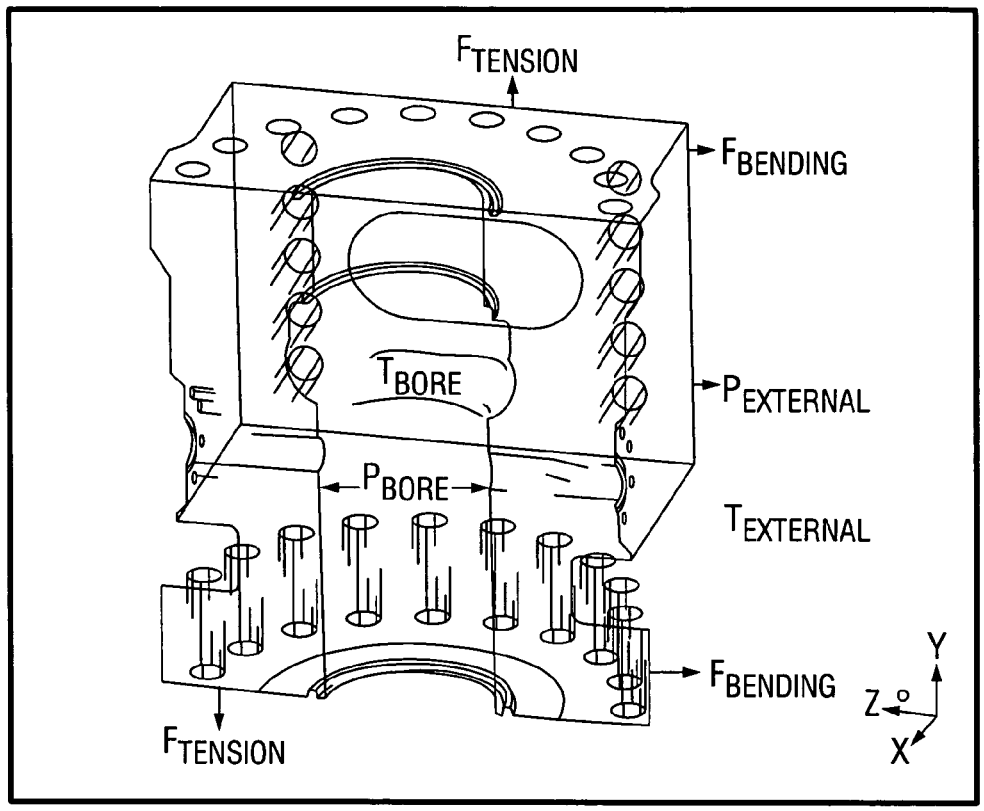
FIG. 2 illustrates a half-section overall model with applied loads and boundary conditions according to embodiments described herein.

Referring now to FIG. 2, an example including a three-dimensional model of a suitably designed 18¾ inch Ram BOP is shown. Typical loads and boundary conditions used in the analyses are also shown in FIG. 2. Based on ASME Section-VIII Div-3 criteria, the BOP model was designed either for high pressure high temperature (HPHT) or extreme high pressure and high temperature application (XHPHT) applications. Before applying the proposed methodology outlined above, such BOP body geometry was designed to satisfy all essential criteria for high pressure (above 15 ksi) and for high temperature (above 250° F.) applications. Based on ASME Section-VIII Division 3 criteria, the subject BOP was considered appropriately designed for structural loads with bore pressures up to 25 ksi and bore temperatures up to 350° F. The model and analyses of the model results may further facilitate any existing BOP design so that sulfide stress corrosion cracking, SSCC, or corrosion related limit conditions be met by selectively weld cladding of higher strength material suitable for use in a NACE environment.

For the subject XHPHT BOP, F22 material with a minimum material yield of 85 ksi was selected. Because necessary post-weld heat treatments (PWHT) would reduce the yield, 80 ksi may be considered to be the final minimum yield strength for the material. For SSCC or NACE environments, appropriate material tests were completed based on TM0177 Method A. Based on industry experience and available test data, it was observed that the specimens fail the TM0177 Method A test with 80% of yield stress level. Based on this, an upper value of 0.8*Minimum Yield Stress, or 64 ksi for F22 material, is considered acceptable.

The BOP was analyzed for three different maximum operating pressures, namely 15 ksi, 20 ksi, and 25 ksi bore pressures without a thermal load. The 20 ksi bore pressure case was also analyzed separately considering the thermal load at 350° F. alongside other loads as specified.

FIG. 2 shows typical loads and boundary conditions used in the analysis. As illustrated, the bore pressure was 24.45 ksi (a 20 ksi differential from external pressure), the bore temperature was 350° F., and the external temperature was 37° F. Finite element analysis (FEA) of the subject BOP was completed taking into account possible loading conditions. The loads include bore pressure, top tension and bending load, and pressure end loads.

Figure 3:
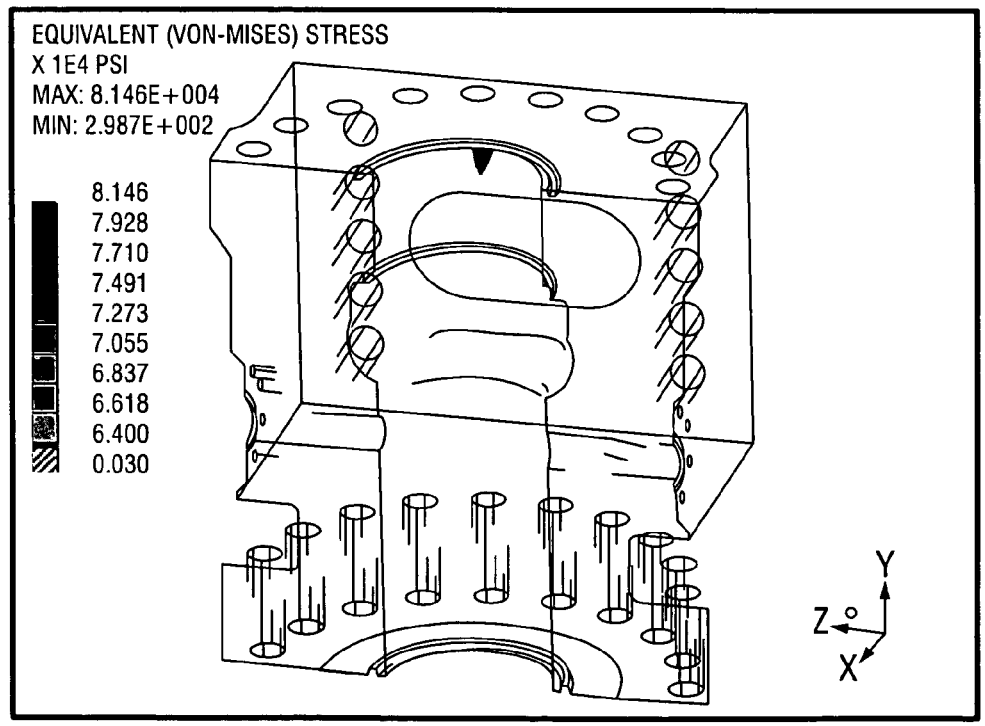
FIG. 3 shows the results of a finite element analysis of the model of FIG. 2 subject to a pressure of 15 ksi.
Figure 4:
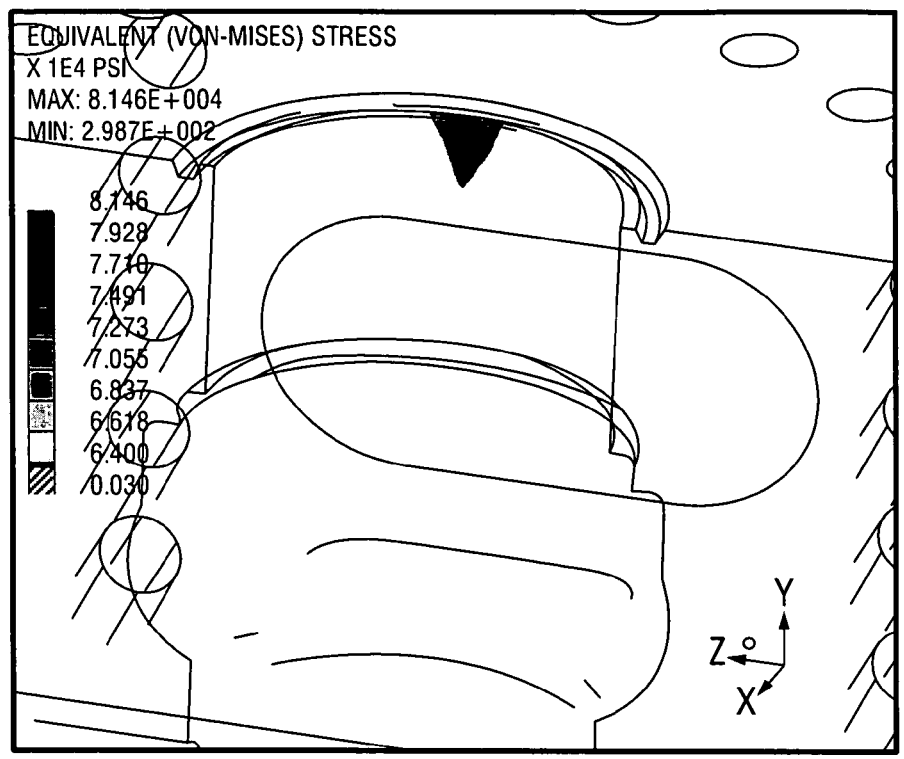
FIG. 4 shows an enlarged view of the results of FIG. 3, focusing on the seat area of the blowout preventer.
Figure 5:
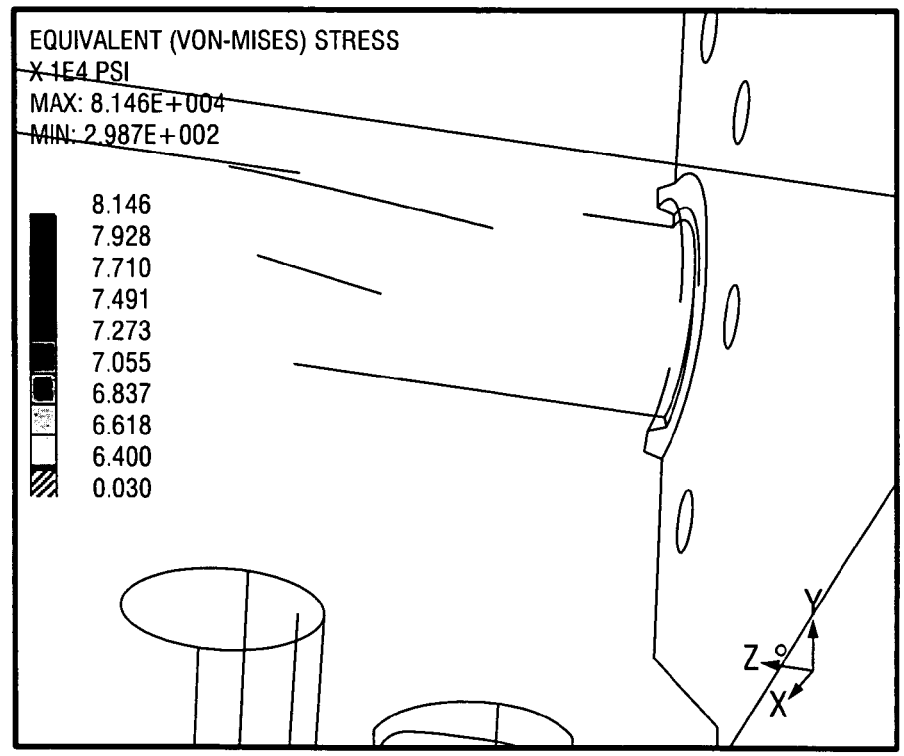
FIG. 5 shows an enlarged view of the results of FIG. 3, focusing on the choke and kill pockets of the blowout preventer.
Figure 6:
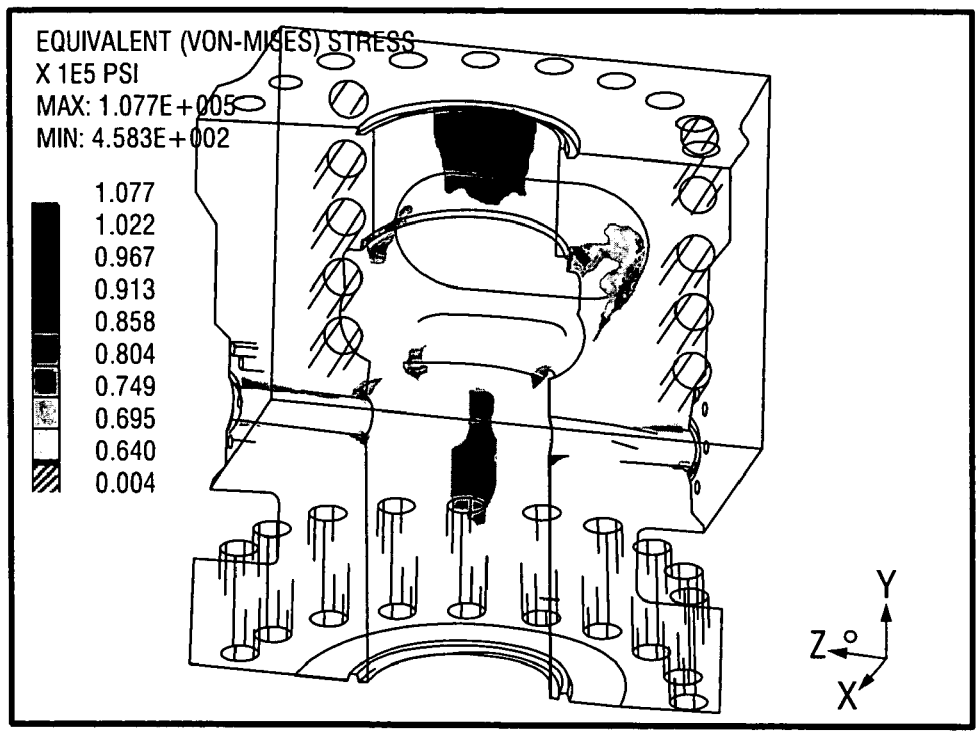
FIG. 6 shows the results of a finite element analysis of the model of FIG. 2 subject to a pressure of 20 ksi.
Figure 7:
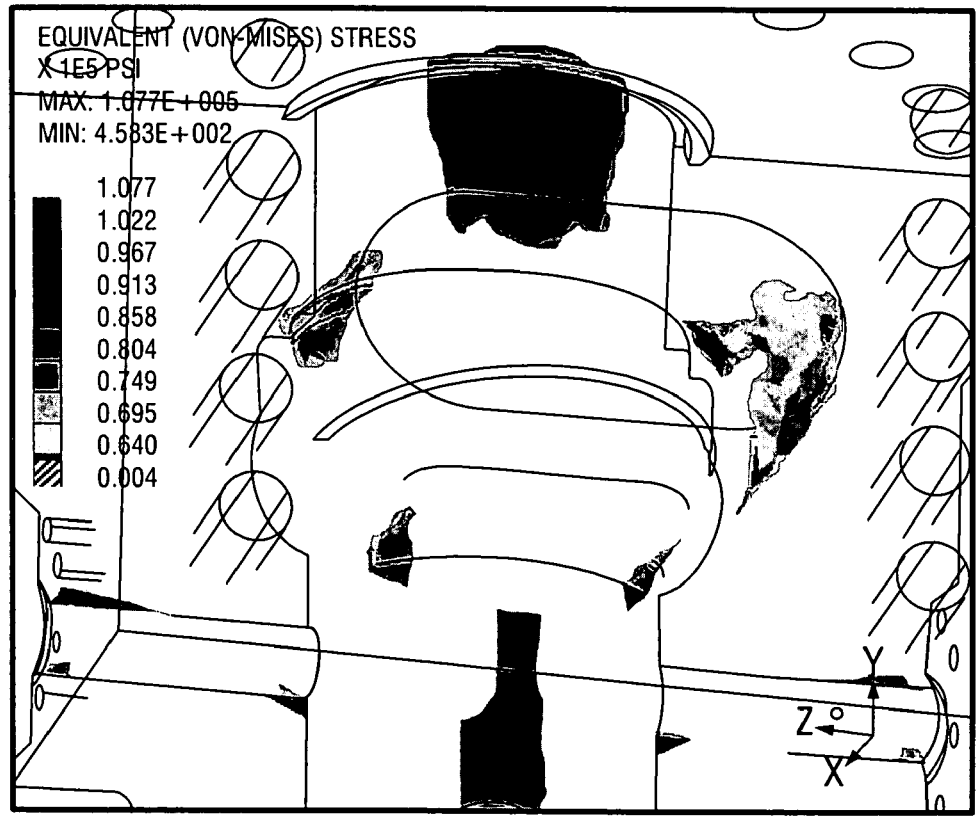
FIG. 7 shows an enlarged view of the results of FIG. 6, focusing on the seat area of the blowout preventer.
Figure 8:
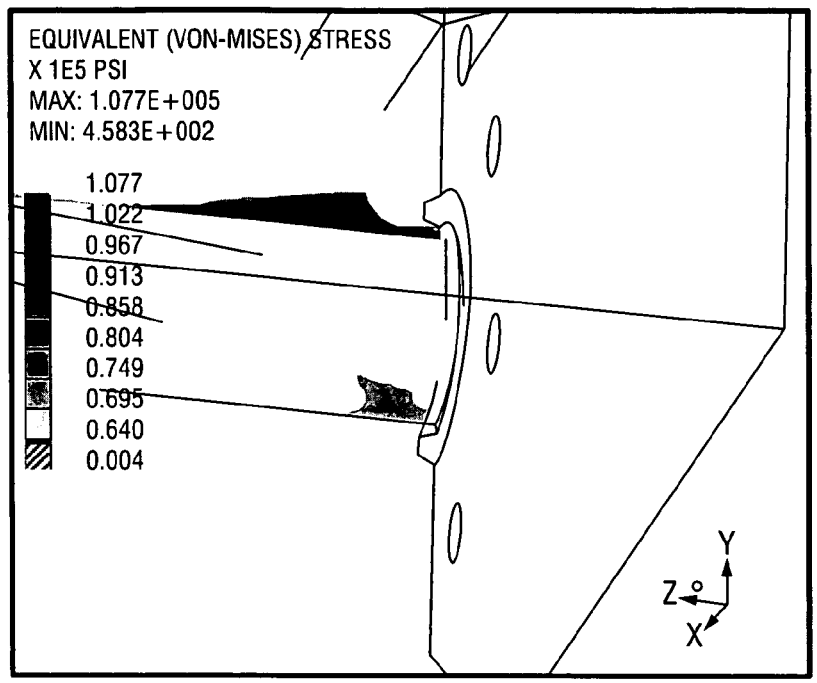
FIG. 8 shows an enlarged view of the results of FIG. 6, focusing on the choke and kill pockets of the blowout preventer.
Figure 9:
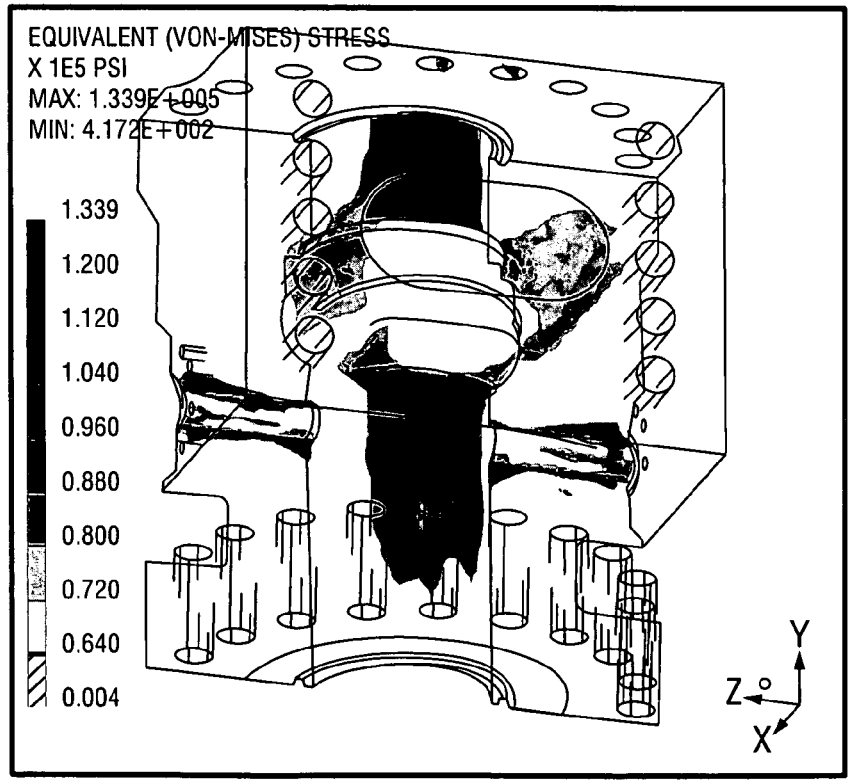
FIG. 9 shows the results of a finite element analysis of the model of FIG. 2 subject to a pressure of 25 ksi.
Figure 10:
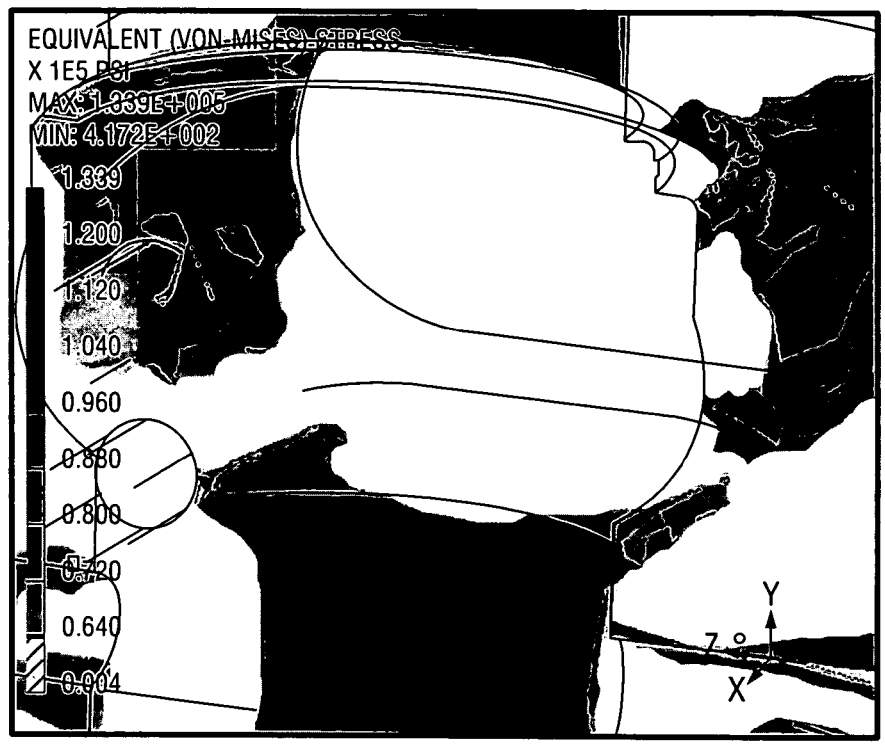
FIG. 10 shows an enlarged view of the results of FIG. 9, focusing on the seat area of the blowout preventer.
Figure 11:
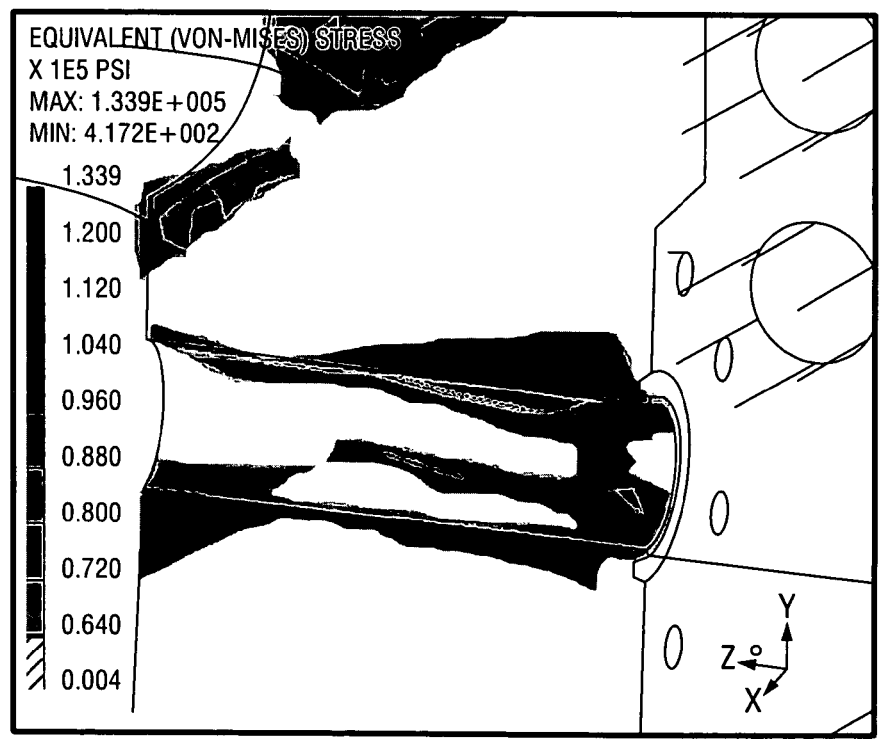
FIG. 11 shows an enlarged view of the results of FIG. 9, focusing on the choke and kill pockets of the blowout preventer.

The results of the finite element analyses are shown in FIGS. 3-14 as von misses stress, VMS, plots. For the VMS plots, FIGS. 3-14, a lower bound stress of 64 ksi was used to isolate all higher stress areas. Only stress zones above 64 ksi are shown in all these figures. FIGS. 3-5 show stresses on the half-section overall model (FIG. 3), close-up on the seat high stress areas (FIG. 4), and close-up on the choke and kill pockets (FIG. 5) for the 15 ksi bore pressure case (with no thermal stress). Similar plots for 20 ksi bore pressure (with no thermal stress) are shown in FIGS. 6-8. FIGS. 9-11 show VMS stresses for 25 ksi bore pressure (with no thermal stress).

Figure 12:
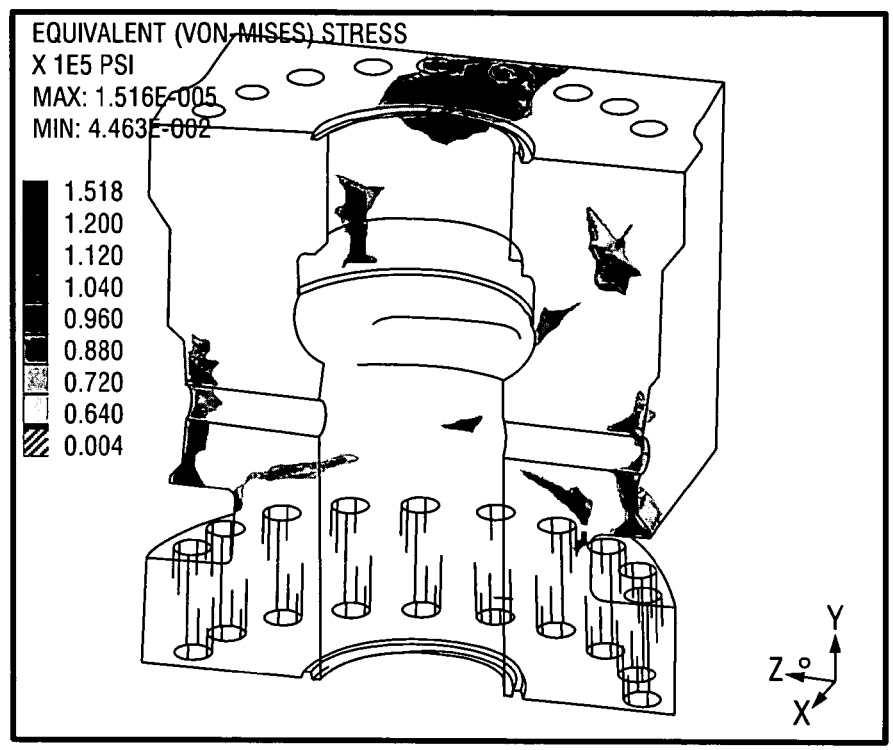
FIG. 12 shows the results of a finite element analysis of the model of FIG. 2 subject to a pressure of 20 ksi and an internal temperature of 350° F.
Figure 13:
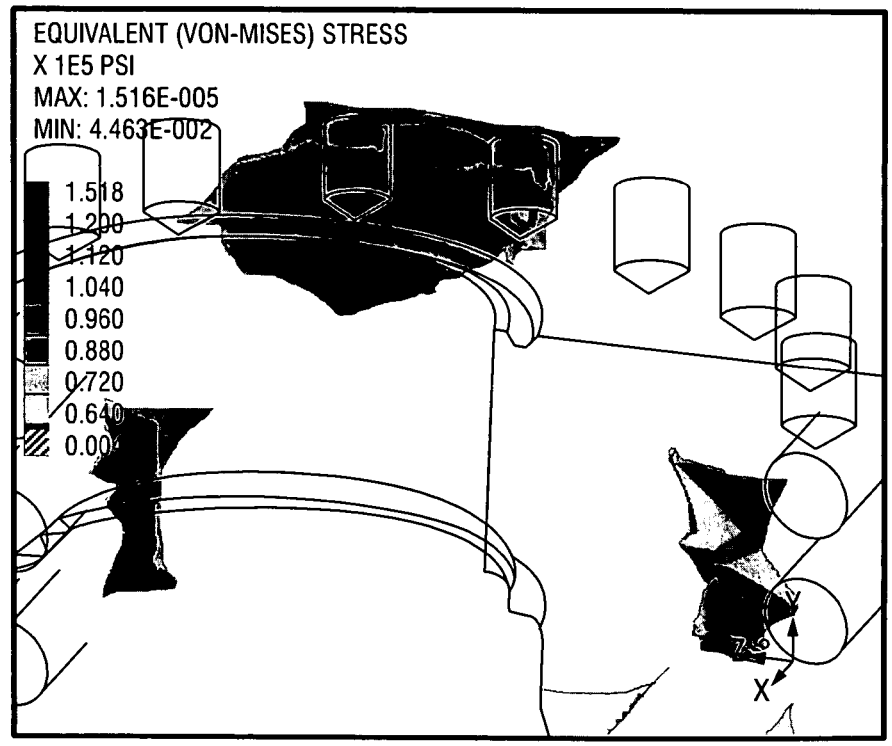
FIG. 13 shows an enlarged view of the results of FIG. 12, focusing on the seat area of the blowout preventer.
Figure 14:
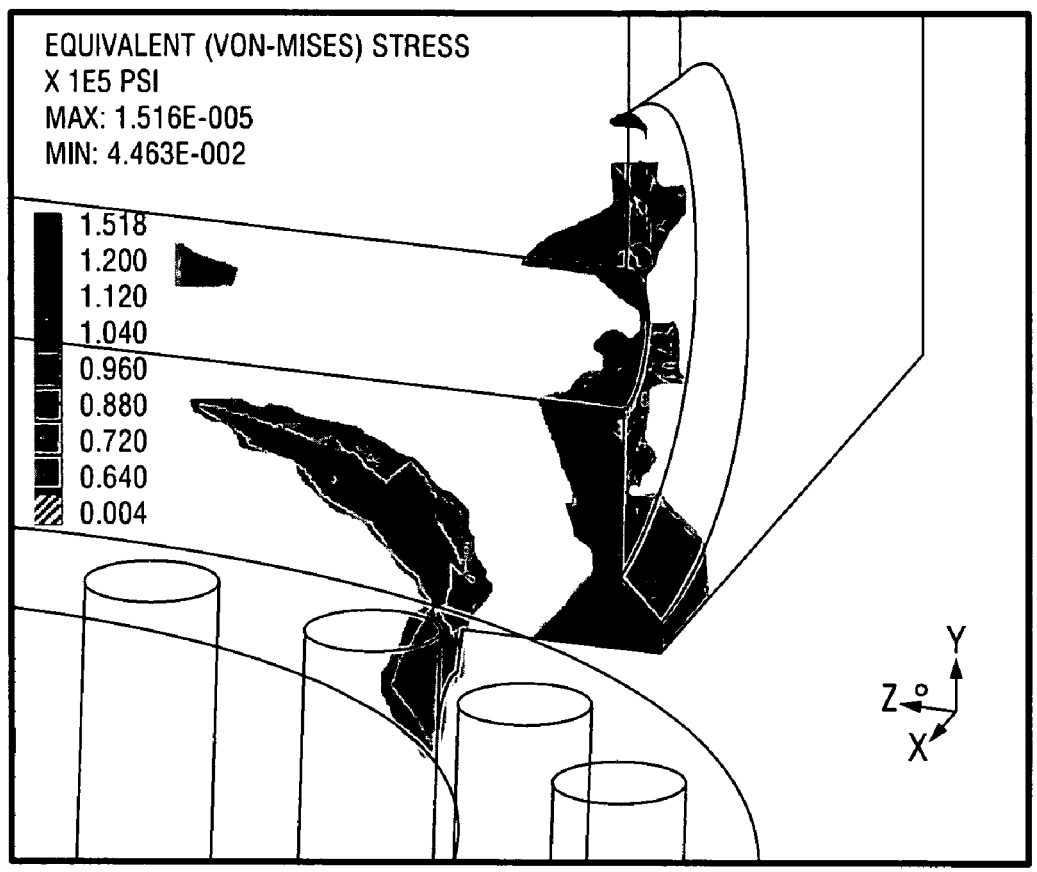
FIG. 14 shows an enlarged view of the results of FIG. 12, focusing on the choke and kill pockets of the blowout preventer.

FIGS. 12-14 show VMS stress for 20 ksi bore pressure with a 350° F. thermal load considered simultaneously as the bore surface temperature. Convective heat transfer coefficients $h_f$, computed via separate CFD analysis, were applied in the sea water exposed areas.

The results of the models indicated that the highest stresses occur in the bore side of the BOP where no thermal loads are applied. Applied thermal stresses, being compressive, decreased the inside stress level significantly, however, the external stresses increased. The external stress areas were considered of minimal consequence to SSCC (or NACE related) constraints. The models indicate that the thermal stress state is a non-conservative issue for the high pressure (HPHT) application, particularly relating to compliance with NACE material requirements.

Next, it was observed that the subject BOP is suitable for NACE application for 15 ksi bore pressure. Except for a few localized spots, where VMS stress is above 64 ksi, the entire BOP stack is appropriately suitable for NACE environment. Minor modification to the model, refined meshing, may eliminate such very small location of high stress (above 64 ksi).

The VMS stress zones above 64 ksi are clearly visible in the results for the 20 ksi and 25 ksi bore pressures, as shown in FIGS. 9-11 and FIGS. 12-14, respectively. These stress plots identify locations and depths of high VMS stress areas above 64 ksi. The highest stress remains below 108 ksi for the 20 ksi bore pressure FEA and below 112 ksi for the 25 ksi bore pressure FEA. A small zone with stress exceeding 112 ksi was observed around the groove area at the top of the BOP. Analysis with a complete assembly indicates that stiffness of the top mating flange and contact stresses from bolt preload would reduce such peak stress. Maximum VMS stress of 120 ksi would remain to be appropriate for 25 ksi bore pressure application.

The depth of the high stress zones indicated by the VMS stress plots can be calculated. NACE compatible material, such as Inconel 725, with 120 ksi minimum yield strength, can have a 90% yield strength of 108 ksi (0.9*120=108) and satisfy the TM0177 Method A test. Therefore, the base material in these zones may be selectively clad with a higher strength corrosion resistant alloy which has been qualified to meet the requirements of NACE MR0175/ISO 15156.

The FEA results additionally show that the localized stresses of the material occur within 0.250 to 0.500 inches of the ID surface of the ram BOP body at or near the 18¾ inch through bore. It may be possible to clad overlay the affected high stress areas with a higher strength material that is qualified to NACE MR0175.

The clad overlay thickness may not need to exceed 0.375 inches to encapsulate the localized stress that may approach 75,000 psi. A clad overlay thickness with a minimum yield strength of 120,000 psi, thick enough to encapsulate the localized stress, may be capable of keeping the localized stress below two thirds of the minimum yield strength of the clad layer required by the base metal. This overlay of higher strength material may be accomplished by a number of different methods as described above.

Embodiments and methods disclosed herein may advantageously provide for generating and analyzing BOP models within FEA using stress analysis to determine the BOP's response under loading conditions characterized by large amounts of stress. The resulting stress analysis may then be used to enhance a BOP design, improving the performance of the BOP at higher temperatures and pressures.

Advantageously, embodiments disclosed herein may provides for a method to establish an overall BOP design based on ASME Section-VIII Div-3 or similar HPHT equipment design guidelines. The BOP may satisfy NACE peak stress and life cycle requirements. Methods and embodiments disclosed herein may provide for a blowout preventer with an increased working lifespan. For example, the BOP may be modeled with simulated loading conditions of repeated closures (i.e., repeatably closing the seal about a drillpipe or itself) or high pressure kicks to determine design features that may extend the working lifespan of the blowout preventer.

Embodiments disclosed herein may also provide for blowout preventers rated for operation at higher temperatures and pressures. For example, embodiments of the blowout preventers disclosed herein may be selectively reinforced to meet the requirements for operation at higher operating pressures, such as 20 ksi, 25 ksi, 30 ksi, or higher. Other embodiments of the blowout preventers disclosed herein may be selectively reinforced to meet the requirements for operation at higher operating temperatures, such as 250° F., 350° F., or higher.

Advantageously, embodiments disclosed herein may provide a method to manufacture a BOP body that is less costly than attempting to manufacture the BOP body from a solid, high strength corrosion resistant alloy that can meet the requirements of NACE MR0175. This is especially true in view of the fact that the mechanical strength of the body beneath the clad layer 0.250 to 0.500 inches from the well bore fluid wetted surfaces may be much lower that that required within that localized stress zone. Other embodiments may provide for the enhancement of existing BOP designs so that sulfide stress corrosion cracking (SSCC) or corrosion related limit conditions may be met by selectively reinforcing the BOP with higher strength material suitable for use in an oil and gas environment.

The selection of the cladding alloy will be principally based on the increased mechanical strength of the clad layer and may also be based on the metallurgical bond achieved between the clad layer and the substrate. An additional attribute of the clad layer may be the corrosion resistance that the cladding alloy will contribute to the blowout preventer. Another attribute of the clad layer is that any scoring or gouging of the interior surface of the ram BOP body is not likely to extend below the depth of the clad layer allowing the clad layer to continue to protect the low alloy steel substrate on which it is deposited. Particularly, the clad layer will also continues to protect the body from the pitting corrosion often found in the cavities of BOP bodies. Moreover, the repair of gouges in the clad layer may be easier and less costly to perform than the repair of similar damage to the low-alloy steel substrate.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed:

1. A method to reinforce an irregular pressure vessel, the method comprising:
   analyzing the irregular pressure vessel;
   identifying regions of high stress concentration in the irregular pressure vessel; and
   selectively reinforcing the regions of high stress concentration,
   wherein the identification of regions of high stress concentration comprises generating a stress plot of the irregular pressure vessel in response to a loading condition on the irregular pressure vessel.

2. The method of claim 1, wherein the irregular pressure vessel is a ram-type blowout preventer.

3. The method of claim 1, wherein the loading condition of the irregular pressure vessel comprises at least one of internal pressure, external pressure, axial tension, axial compression, longitudinal tension, longitudinal compression, axial bending moment, or longitudinal bending moment.

4. The method of claim 1, wherein the selective reinforcement comprises a clad overlay.

5. The method of claim 4, further comprising selecting a thickness of the clad overlay based upon a result of the analysis of the irregular pressure vessel.

6. The method of claim 4, wherein the clad overlay is formed by at least one of electric arc weld cladding, hot isostatic press cladding, and auto frettage cladding.

7. The method of claim 1, wherein the selective reinforcement comprises a clad inlay.

8. The method of claim 7, wherein the inlay is shrink-fit or press-fit into a recess cut in the irregular pressure vessel and welded in place.

9. The method of claim 7, wherein the clad inlay is shaped based upon a result of a finite element analysis of the irregular pressure vessel.

10. A method to reinforce an irregular pressure vessel, the method comprising:
    analyzing the irregular pressure vessel;
    identifying regions of high stress concentration in the irregular pressure vessel; and
    selectively reinforcing the regions of high stress concentration,
    wherein a loading condition of the irregular pressure vessel comprises at least one of internal pressure, external pressure, axial tension, axial compression, longitudinal tension, longitudinal compression, axial bending moment, or longitudinal bending moment.

11. The method of claim 10, wherein the irregular pressure vessel is a ram-type blowout preventer.

12. The method of claim 10, wherein the identification of regions of high stress concentration comprises generating a stress plot of the irregular pressure vessel in response to the loading condition on the irregular pressure vessel.

13. The method of claim 10, wherein the selective reinforcement comprises a clad overlay.

14. The method of claim 13, further comprising selecting a thickness of the clad overlay based upon a result of the analysis of the irregular pressure vessel.

15. The method of claim 13, wherein the clad overlay is formed by at least one of electric arc weld cladding, hot isostatic press cladding, and auto frettage cladding.

16. The method of claim 10, wherein the selective reinforcement comprises a clad inlay.

17. The method of claim 16, wherein the inlay is shrink-fit or press-fit into a recess cut in the irregular pressure vessel and welded in place.

18. The method of claim 16, wherein the clad inlay is shaped based upon a result of a finite element analysis of the irregular pressure vessel.

* * * * *